United States Patent
Berger et al.

(10) Patent No.: US 10,699,761 B2
(45) Date of Patent: Jun. 30, 2020

(54) WORD LINE DECODER MEMORY ARCHITECTURE

(71) Applicant: SPIN MEMORY, Inc., Fremont, CA (US)

(72) Inventors: Neal Berger, Cupertino, CA (US); Susmita Karmakar, Fremont, CA (US); Benjamin Louie, Fremont, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 16/134,869

(22) Filed: Sep. 18, 2018

(65) Prior Publication Data

US 2020/0090721 A1    Mar. 19, 2020

(51) Int. Cl.
*G11C 8/08*     (2006.01)
*G11C 11/16*    (2006.01)
*G11C 8/10*     (2006.01)
*G11C 5/14*     (2006.01)

(52) U.S. Cl.
CPC .................. *G11C 8/08* (2013.01); *G11C 5/14* (2013.01); *G11C 8/10* (2013.01); *G11C 11/1657* (2013.01); *G11C 11/1659* (2013.01)

(58) Field of Classification Search
CPC ................ G11C 8/10; G11C 8/08; G11C 5/14
See application file for complete search history.

(56) References Cited

U.S. PATENT DOCUMENTS

| | | |
|---|---|---|
| 4,597,487 A | 7/1986 | Crosby et al. |
| 5,541,868 A | 7/1996 | Prinz |
| 5,559,952 A | 9/1996 | Fujimoto |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakahima et al. |
| 5,695,846 A | 12/1997 | Lange et al. |
| 5,695,864 A | 12/1997 | Zlonczweski |
| 5,732,016 A | 3/1998 | Chen et al. |
| 5,751,647 A | 5/1998 | O'Toole |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |

(Continued)

FOREIGN PATENT DOCUMENTS

| | | |
|---|---|---|
| CA | 2766141 | 1/2011 |
| CN | 105706259 | 6/2016 |

(Continued)

OTHER PUBLICATIONS

US 7,026,672 B2, 04/2006, Grandis (withdrawn)

(Continued)

*Primary Examiner* — Vanthu T Nguyen

(57) ABSTRACT

A clocked driver circuit can include a level shifter latch and a driver. The level shifter latch can be configured to receive an input signal upon a clock signal and generate a level shifted output signal. The driver can be configured to receive the level shifted output signal from the level shifter and drive the output signal on a line. The signal levels of the output signal can be greater than the signal level of the input signal.

9 Claims, 7 Drawing Sheets

(56) References Cited

U.S. PATENT DOCUMENTS

| | | | |
|---|---|---|---|
| 6,064,948 A | 5/2000 | West |
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Radon et al. |
| 6,538,918 B2 | 3/2003 | Swanson et al. |
| 6,545,903 B1 | 4/2003 | Savtchenko et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,731,537 B2 | 5/2004 | Kanamori |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,812,437 B2 | 11/2004 | Levy |
| 6,829,161 B2 | 12/2004 | Huai et al. |
| 6,835,423 B2 | 12/2004 | Chen et al. |
| 6,838,740 B2 | 1/2005 | Huai et al. |
| 6,839,821 B2 | 1/2005 | Estakhri |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,938,142 B2 | 8/2005 | Pawlowski |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,371 B2 | 2/2006 | Matsuoka |
| 7,006,375 B2 | 2/2006 | Covington |
| 7,009,877 B1 | 3/2006 | Huai et al. |
| 7,041,598 B2 | 5/2006 | Sharma |
| 7,045,368 B2 | 5/2006 | Hong et al. |
| 7,057,922 B2 | 6/2006 | Fukumoto |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,324,387 B1 | 1/2008 | Bergemont et al. |
| 7,335,960 B2 | 2/2008 | Han et al. |
| 7,351,594 B2 | 4/2008 | Bae et al. |
| 7,352,021 B2 | 4/2008 | Bae et al. |
| 7,372,722 B2 | 5/2008 | Jeong |
| 7,376,006 B2 | 5/2008 | Bednorz et al. |
| 7,386,765 B2 | 6/2008 | Ellis |
| 7,436,699 B2 | 10/2008 | Tanizaki |
| 7,443,223 B2 * | 10/2008 | Bajkowski ....... H03K 3/356121 |
| | | 326/68 |
| 7,449,345 B2 | 11/2008 | Horng et al. |
| 7,453,719 B2 | 11/2008 | Sakimura |
| 7,476,919 B2 | 1/2009 | Hong et al. |
| 7,502,249 B1 | 3/2009 | Ding |
| 7,573,737 B2 | 8/2009 | Kent et al. |
| 7,598,555 B1 | 10/2009 | Papworth-Parkin |
| 7,619,431 B2 | 11/2009 | DeWilde et al. |
| 7,642,612 B2 | 1/2010 | Izumi et al. |
| 7,660,161 B2 | 2/2010 | Van Tran |
| 7,733,699 B2 | 6/2010 | Roohparvar |
| 7,773,439 B2 | 8/2010 | Do et al. |
| 7,776,665 B2 | 8/2010 | Izumi et al. |
| 7,800,407 B1 * | 9/2010 | Agarwal ....... H03K 19/018521 |
| | | 326/68 |
| 7,852,662 B2 | 12/2010 | Yang |
| 7,881,095 B2 | 2/2011 | Lu |
| 7,911,832 B2 | 3/2011 | Kent et al. |
| 7,936,595 B2 | 5/2011 | Han et al. |
| 7,986,544 B2 | 7/2011 | Kent et al. |
| 8,080,365 B2 | 12/2011 | Nozaki |
| 8,088,556 B2 | 1/2012 | Nozaki |
| 8,094,480 B2 | 1/2012 | Tonomura |
| 8,144,509 B2 | 3/2012 | Jung |
| 8,148,970 B2 | 4/2012 | Fuse |
| 8,164,971 B2 * | 4/2012 | Wang ................ G11C 11/417 |
| | | 365/189.08 |
| 8,255,742 B2 | 8/2012 | Ipek |
| 8,278,996 B2 | 10/2012 | Miki |
| 8,279,666 B2 | 10/2012 | Dieny et al. |
| 8,334,213 B2 | 12/2012 | Mao |
| 8,349,536 B2 | 1/2013 | Nozaki |
| 8,363,465 B2 | 1/2013 | Kent et al. |
| 8,386,836 B2 | 2/2013 | Burger |
| 8,432,727 B2 | 4/2013 | Ryu |
| 8,441,844 B2 | 5/2013 | El Baraji |
| 8,456,883 B1 | 6/2013 | Liu |
| 8,456,926 B2 | 6/2013 | Ong |
| 8,492,881 B2 | 7/2013 | Kuroiwa et al. |
| 8,535,952 B2 | 9/2013 | Ranjan et al. |
| 8,539,303 B2 | 9/2013 | Lu |
| 8,549,303 B2 | 10/2013 | Fifield et al. |
| 8,574,928 B2 | 11/2013 | Satoh et al. |
| 8,582,353 B2 | 11/2013 | Lee |
| 8,593,868 B2 | 11/2013 | Park |
| 8,617,408 B2 | 12/2013 | Balamane |
| 8,625,339 B2 | 1/2014 | Ong |
| 8,634,232 B2 | 1/2014 | Oh |
| 8,716,817 B2 | 5/2014 | Saida |
| 8,737,137 B1 | 5/2014 | Choy et al. |
| 8,780,617 B2 | 7/2014 | Kang |
| 8,792,269 B1 | 7/2014 | Abedifard |
| 8,824,237 B2 * | 9/2014 | Wang ................... G11C 8/10 |
| | | 365/226 |
| 8,852,760 B2 | 10/2014 | Wang et al. |
| 8,902,628 B2 | 12/2014 | Ha |
| 8,966,345 B2 | 2/2015 | Wilkerson |
| 9,019,754 B1 | 4/2015 | Bedeschi |
| 9,026,888 B2 | 5/2015 | Kwok |
| 9,043,674 B2 | 5/2015 | Wu |
| 9,082,888 B2 | 7/2015 | Kent et al. |
| 9,104,595 B2 | 8/2015 | Sah |
| 9,140,747 B2 | 9/2015 | Kim |
| 9,165,629 B2 | 10/2015 | Chih |
| 9,166,155 B2 | 10/2015 | Deshpande |

(56) References Cited

U.S. PATENT DOCUMENTS

| | | |
|---|---|---|
| 9,229,853 B2 | 1/2016 | Khan |
| 9,245,608 B2 | 1/2016 | Chen et al. |
| 9,250,990 B2 | 2/2016 | Motwani |
| 9,263,667 B1 | 2/2016 | Pinarbasi |
| 9,298,552 B2 | 3/2016 | Leem |
| 9,299,412 B2 | 3/2016 | Naeimi |
| 9,317,429 B2 | 4/2016 | Ramanujan |
| 9,337,412 B2 | 5/2016 | Pinarbasi et al. |
| 9,362,486 B2 | 6/2016 | Kim et al. |
| 9,378,317 B2 | 6/2016 | Kawai |
| 9,396,991 B2 | 7/2016 | Arvin et al. |
| 9,401,336 B2 | 7/2016 | Arvin et al. |
| 9,406,876 B2 | 8/2016 | Pinarbasi |
| 9,418,721 B2 | 8/2016 | Bose |
| 9,449,720 B1 | 9/2016 | Lung |
| 9,450,180 B1 | 9/2016 | Annunziata |
| 9,455,013 B2 | 9/2016 | Kim |
| 9,472,282 B2 | 10/2016 | Lee |
| 9,472,748 B2 | 10/2016 | Kuo et al. |
| 9,484,527 B2 | 11/2016 | Han et al. |
| 9,488,416 B2 | 11/2016 | Fujita et al. |
| 9,508,456 B1 | 11/2016 | Shim |
| 9,548,445 B2 | 1/2017 | Lee et al. |
| 9,553,102 B2 | 1/2017 | Wang |
| 9,583,167 B2 | 2/2017 | Chung |
| 9,728,712 B2 | 8/2017 | Kardasz et al. |
| 9,741,926 B1 | 8/2017 | Pinarbasi et al. |
| 9,772,555 B2 | 9/2017 | Park et al. |
| 9,773,974 B2 | 9/2017 | Pinarbasi et al. |
| 9,853,006 B2 | 12/2017 | Arvin et al. |
| 9,853,206 B2 | 12/2017 | Pinarbasi et al. |
| 9,853,292 B2 | 12/2017 | Loveridge et al. |
| 9,865,806 B2 | 1/2018 | Choi et al. |
| 10,026,609 B2 | 7/2018 | Sreenivasan et al. |
| 10,043,851 B1 | 8/2018 | Shen |
| 10,115,446 B1 | 10/2018 | Louie et al. |
| 10,163,479 B2 | 12/2018 | Yoha |
| 2002/0057593 A1 | 5/2002 | Hidaka |
| 2002/0090533 A1 | 7/2002 | Zhang et al. |
| 2002/0105823 A1 | 8/2002 | Redon et al. |
| 2002/0132140 A1 | 9/2002 | Igarashi et al. |
| 2003/0085186 A1 | 5/2003 | Fujioka |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0026369 A1 | 2/2004 | Ying |
| 2004/0047179 A1 | 3/2004 | Chan |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0173315 A1 | 9/2004 | Leung |
| 2004/0197174 A1 | 10/2004 | Van Den Berg |
| 2004/0221030 A1 | 11/2004 | Huras |
| 2004/0257717 A1 | 12/2004 | Sharma et al. |
| 2005/0022746 A1 | 2/2005 | Lampe |
| 2005/0029551 A1 | 2/2005 | Atwood et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0160205 A1 | 7/2005 | Kuo |
| 2005/0174702 A1 | 8/2005 | Gill |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0251628 A1 | 11/2005 | Jarvis et al. |
| 2005/0280058 A1 | 12/2005 | Pakala et al. |
| 2005/0285176 A1 | 12/2005 | Kim |
| 2006/0018057 A1 | 1/2006 | Huai |
| 2006/0049472 A1 | 3/2006 | Diao et al. |
| 2006/0077734 A1 | 4/2006 | Fong |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0198202 A1 | 9/2006 | Erez |
| 2006/0227465 A1 | 10/2006 | Inokuchi et al. |
| 2006/0271755 A1 | 11/2006 | Miura |
| 2006/0284183 A1 | 12/2006 | Izumi et al. |
| 2006/0291305 A1 | 12/2006 | Suzuki et al. |
| 2007/0019337 A1 | 1/2007 | Apalkov et al. |
| 2007/0094573 A1 | 4/2007 | Chen |
| 2007/0096229 A1 | 5/2007 | Yoshikawa |
| 2007/0220935 A1 | 9/2007 | Cernea |
| 2007/0226592 A1 | 9/2007 | Radke |
| 2007/0242501 A1 | 10/2007 | Hung et al. |
| 2007/0283313 A1 | 12/2007 | Ogawa |
| 2007/0285972 A1 | 12/2007 | Horii |
| 2008/0049487 A1 | 2/2008 | Yoshimura |
| 2008/0049488 A1 | 2/2008 | Rizzo |
| 2008/0079530 A1 | 4/2008 | Weidman et al. |
| 2008/0112094 A1 | 5/2008 | Kent et al. |
| 2008/0144376 A1 | 6/2008 | Lee |
| 2008/0151614 A1 | 6/2008 | Guo |
| 2008/0181009 A1 | 7/2008 | Arai |
| 2008/0259508 A2 | 10/2008 | Kent et al. |
| 2008/0294938 A1 | 11/2008 | Kondo |
| 2008/0297292 A1 | 12/2008 | Viala et al. |
| 2009/0040825 A1 | 2/2009 | Adusumilli et al. |
| 2009/0046501 A1 | 2/2009 | Ranjan et al. |
| 2009/0072185 A1 | 3/2009 | Raksha et al. |
| 2009/0078927 A1 | 3/2009 | Mao |
| 2009/0080267 A1 | 3/2009 | Bedeschi |
| 2009/0091037 A1 | 4/2009 | Assefa et al. |
| 2009/0098413 A1 | 4/2009 | Kanegae |
| 2009/0130779 A1 | 5/2009 | Li |
| 2009/0146231 A1 | 6/2009 | Kuper et al. |
| 2009/0161421 A1 | 6/2009 | Cho et al. |
| 2009/0209102 A1 | 8/2009 | Zhong et al. |
| 2009/0231909 A1 | 9/2009 | Dieny et al. |
| 2010/0039136 A1 | 2/2010 | Chua-Eoan |
| 2010/0080040 A1 | 4/2010 | Choi |
| 2010/0087048 A1 | 4/2010 | Izumi et al. |
| 2010/0110803 A1 | 5/2010 | Arai |
| 2010/0124091 A1 | 5/2010 | Cowburn |
| 2010/0162065 A1 | 6/2010 | Norman |
| 2010/0193891 A1 | 8/2010 | Wang et al. |
| 2010/0195362 A1 | 8/2010 | Norman |
| 2010/0195401 A1 | 8/2010 | Jeong et al. |
| 2010/0227275 A1 | 9/2010 | Nozaki |
| 2010/0232206 A1 | 9/2010 | Li |
| 2010/0246254 A1 | 9/2010 | Prejbeanu et al. |
| 2010/0248154 A1 | 9/2010 | Nozaki |
| 2010/0254181 A1 | 10/2010 | Chung |
| 2010/0271090 A1 | 10/2010 | Rasmussen |
| 2010/0271870 A1 | 10/2010 | Zheng et al. |
| 2010/0277976 A1 | 11/2010 | Oh |
| 2010/0290275 A1 | 11/2010 | Park |
| 2010/0311243 A1 | 12/2010 | Mao |
| 2011/0001108 A1 | 1/2011 | Greene |
| 2011/0032645 A1 | 2/2011 | Noel et al. |
| 2011/0058412 A1 | 3/2011 | Zheng et al. |
| 2011/0061786 A1 | 3/2011 | Mason |
| 2011/0076620 A1 | 3/2011 | Nozaki |
| 2011/0089511 A1 | 4/2011 | Keshtbod et al. |
| 2011/0133298 A1 | 6/2011 | Chen et al. |
| 2011/0283135 A1 | 11/2011 | Burger |
| 2011/0310691 A1 | 12/2011 | Zhou et al. |
| 2011/0320596 A1 | 12/2011 | Fee et al. |
| 2012/0028373 A1 | 2/2012 | Belen |
| 2012/0052258 A1 | 3/2012 | Op DeBeeck et al. |
| 2012/0069649 A1 | 3/2012 | Ranjan et al. |
| 2012/0127804 A1 | 5/2012 | Ong et al. |
| 2012/0155158 A1 | 6/2012 | Higo |
| 2012/0163113 A1 | 6/2012 | Hatano et al. |
| 2012/0280336 A1 | 6/2012 | Watts |
| 2012/0181642 A1 | 7/2012 | Prejbeanu et al. |
| 2012/0188818 A1 | 7/2012 | Ranjan et al. |
| 2012/0221905 A1 | 8/2012 | Burger |

(56) References Cited

U.S. PATENT DOCUMENTS

| | | |
|---|---|---|
| 2012/0228728 A1 | 9/2012 | Ueki et al. |
| 2012/0239969 A1 | 9/2012 | Dickens |
| 2012/0254636 A1 | 10/2012 | Tsukamoto et al. |
| 2012/0280339 A1 | 11/2012 | Zhang et al. |
| 2012/0294078 A1 | 11/2012 | Kent et al. |
| 2012/0299133 A1 | 11/2012 | Son et al. |
| 2012/0324274 A1 | 12/2012 | Hori |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0039119 A1 | 2/2013 | Rao |
| 2013/0044537 A1 | 2/2013 | Ishigaki |
| 2013/0075845 A1 | 3/2013 | Chen et al. |
| 2013/0107633 A1 | 5/2013 | Kim |
| 2013/0244344 A1 | 9/2013 | Malmhall |
| 2013/0267042 A1 | 10/2013 | Satoh et al. |
| 2013/0270523 A1 | 10/2013 | Wang et al. |
| 2013/0270661 A1 | 10/2013 | Yi et al. |
| 2013/0275691 A1 | 10/2013 | Chew |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0036573 A1 | 2/2014 | Ishihara |
| 2014/0042571 A1 | 2/2014 | Gan et al. |
| 2014/0048896 A1 | 2/2014 | Huang et al. |
| 2014/0063949 A1 | 3/2014 | Tokiwa |
| 2014/0070341 A1 | 3/2014 | Beach et al. |
| 2014/0089762 A1 | 3/2014 | Pangal et al. |
| 2014/0103469 A1 | 4/2014 | Jan |
| 2014/0103472 A1 | 4/2014 | Kent et al. |
| 2014/0136870 A1 | 5/2014 | Breternitz et al. |
| 2014/0149827 A1 | 5/2014 | Kim et al. |
| 2014/0151837 A1 | 6/2014 | Ryu |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0219034 A1 | 8/2014 | Gomez et al. |
| 2014/0252439 A1 | 9/2014 | Guo |
| 2014/0264671 A1 | 9/2014 | Chepulskyy et al. |
| 2014/0269005 A1 | 9/2014 | Kang |
| 2014/0281284 A1 | 9/2014 | Block et al. |
| 2014/0289358 A1 | 9/2014 | Lindamood |
| 2014/0321196 A1 | 10/2014 | Ikeda |
| 2015/0056368 A1 | 2/2015 | Wang et al. |
| 2015/0098287 A1 | 4/2015 | Lee |
| 2015/0100848 A1 | 4/2015 | Kalamatianos |
| 2015/0135039 A1 | 5/2015 | Mekhanik et al. |
| 2015/0143343 A1 | 5/2015 | Weiss |
| 2015/0154116 A1 | 6/2015 | Dittrich |
| 2015/0171316 A1 | 6/2015 | Park et al. |
| 2015/0206568 A1 | 7/2015 | Bose et al. |
| 2015/0206569 A1 | 7/2015 | Bose et al. |
| 2015/0242269 A1 | 8/2015 | Pelley et al. |
| 2015/0262701 A1 | 9/2015 | Takizawa |
| 2015/0278011 A1 | 10/2015 | Keppel et al. |
| 2015/0279904 A1 | 10/2015 | Pinarbasi et al. |
| 2015/0378814 A1 | 12/2015 | Webb et al. |
| 2015/0380088 A1 | 12/2015 | Naeimi et al. |
| 2016/0027525 A1 | 1/2016 | Kim et al. |
| 2016/0027999 A1 | 1/2016 | Pinarbasi |
| 2016/0043304 A1 | 2/2016 | Chen |
| 2016/0056072 A1 | 2/2016 | Arvin et al. |
| 2016/0085443 A1 | 3/2016 | Tomishima et al. |
| 2016/0085621 A1 | 3/2016 | Motwani |
| 2016/0085692 A1 | 3/2016 | Kwok |
| 2016/0086600 A1 | 3/2016 | Bauer et al. |
| 2016/0087193 A1 | 3/2016 | Pinarbasi et al. |
| 2016/0093798 A1 | 3/2016 | Kim et al. |
| 2016/0111634 A1 | 4/2016 | Lee et al. |
| 2016/0118249 A1 | 4/2016 | Sreenivasan et al. |
| 2016/0124299 A1 | 5/2016 | Yu et al. |
| 2016/0126201 A1 | 5/2016 | Arvin et al. |
| 2016/0126452 A1 | 5/2016 | Kuo et al. |
| 2016/0126453 A1 | 5/2016 | Chen et al. |
| 2016/0148685 A1 | 5/2016 | Roy |
| 2016/0163965 A1 | 6/2016 | Han et al. |
| 2016/0163973 A1 | 6/2016 | Pinarbasi |
| 2016/0181508 A1 | 6/2016 | Lee et al. |
| 2016/0218278 A1 | 7/2016 | Pinarbasi et al. |
| 2016/0260486 A1 | 9/2016 | Tani |
| 2016/0268499 A1 | 9/2016 | You |
| 2016/0283385 A1 | 9/2016 | Boyd et al. |
| 2016/0284762 A1 | 9/2016 | Wang et al. |
| 2016/0300615 A1 | 10/2016 | Lee |
| 2016/0307860 A1 | 10/2016 | Arvin et al. |
| 2016/0315118 A1 | 10/2016 | Kardasz et al. |
| 2016/0315249 A1 | 10/2016 | Kardasz et al. |
| 2016/0315259 A1 | 10/2016 | Fennimore et al. |
| 2016/0358778 A1 | 12/2016 | Park et al. |
| 2016/0372656 A1 | 12/2016 | Pinarbasi et al. |
| 2016/0378592 A1 | 12/2016 | Ikegami et al. |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0047107 A1 | 2/2017 | Berger et al. |
| 2017/0062712 A1 | 3/2017 | Choi et al. |
| 2017/0069837 A1 | 3/2017 | Choi et al. |
| 2017/0084826 A1 | 3/2017 | Zhou et al. |
| 2017/0123991 A1 | 5/2017 | Sela et al. |
| 2017/0133104 A1 | 5/2017 | Darbari et al. |
| 2017/0199459 A1 | 7/2017 | Ryu et al. |
| 2017/0222132 A1 | 8/2017 | Pinarbasi et al. |
| 2017/0270988 A1 | 9/2017 | Ikegami |
| 2018/0018134 A1 | 1/2018 | Kang |
| 2018/0019343 A1 | 1/2018 | Asami |
| 2018/0033957 A1 | 2/2018 | Zhang |
| 2018/0097175 A1 | 4/2018 | Chuang |
| 2018/0114589 A1 | 4/2018 | El-Baraji et al. |
| 2018/0119278 A1 | 5/2018 | Kornmeyer |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0130945 A1 | 5/2018 | Choi et al. |
| 2018/0211821 A1 | 7/2018 | Kogler |
| 2018/0233362 A1 | 8/2018 | Glodde |
| 2018/0233363 A1 | 8/2018 | Glodde |
| 2018/0248110 A1 | 8/2018 | Kardasz et al. |
| 2018/0248113 A1 | 8/2018 | Pinarbasi et al. |
| 2018/0331279 A1 | 11/2018 | Shen |

FOREIGN PATENT DOCUMENTS

| | | |
|---|---|---|
| EP | 1345277 | 9/2003 |
| FR | 2817998 | 6/2002 |
| FR | 2832542 | 5/2003 |
| FR | 2910716 | 6/2008 |
| JP | H10-004012 | 1/1998 |
| JP | H11-120758 | 4/1999 |
| JP | H11-352867 | 12/1999 |
| JP | 2001-195878 | 7/2001 |
| JP | 2002-261352 | 9/2002 |
| JP | 2002-357489 | 12/2002 |
| JP | 2003-318461 | 11/2003 |
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| JP | 2015-002352 | 1/2015 |
| KR | 10-2014-015246 | 9/2014 |
| WO | 2009-080636 | 7/2009 |

(56) References Cited

FOREIGN PATENT DOCUMENTS

WO 2011-005484 1/2011
WO 2014-062681 4/2014

OTHER PUBLICATIONS

US 2016/0218273 A1, 06/2016, Pinarbasi (withdrawn)
Bhatti Sarpreet et al., "Spintronics Based Random Access Memory: a Review," Material Today, Nov. 2107, pp. 530-548, vol. 20, No. 9, Elsevier,.
Helia Naeimi, et al., "STTRAM Scaling and Retention Failure," Intel Technology Journal, vol. 17, Issue 1, 2013, pp. 54-75 (22 pages).
S. Ikeda, et al., "A Perpendicular-Anisotropy CoFeB-MgO Magnetic Tunnel Junction", Nature Materials, vol. 9, Sep. 2010, pp. 721-724 (4 pages).
R.H. Kock, et al., "Thermally Assisted Magnetization Reversal in Submicron-Sized Magnetic Thin Films", Physical Review Letters, The American Physical Society, vol. 84, No, 23, Jun. 5, 2000, pp. 5419-5422 (4 pages).
K.J. Lee, et al., "Analytical Investigation of Spin-Transfer Dynamics Using a Perpendicular-to-Plane Polarizer", Applied Physics Letters, American Insitute of Physics, vol. 86, (2005), pp. 022505-1 to 022505-3 (3 pages).
Kirsten Martens, et al., "Thermally Induced Magnetic Switching in Thin Ferromagnetic Annuli", NSF grants PHY-0351964 (DLS), 2005, 11 pages.
Kristen Martens, et al., "Magnetic Reversal in Nanoscropic Ferromagnetic Rings", NSF grants PHY-0351964 (DLS) 2006, 23 pages.
"Magnetic Technology Spintronics, Media and Interface", Data Storage Institute, R&D Highlights, Sep. 2010, 3 pages.
Daniel Scott Matic, "A Magnetic Tunnel Junction Compact Model for STT-RAM and MeRAM", Master Thesis University of California, Los Angeles, 2013, pp. 43.

\* cited by examiner

WORD LINE DECODER MEMORY ARCHITECTURE

BACKGROUND

Computing systems have made significant contributions toward the advancement of modern society and are utilized in a number of applications to achieve advantageous results. Numerous devices, such as desktop personal computers (PCs), laptop PCs, tablet PCs, netbooks, smart phones, servers, and the like have facilitated increased productivity and reduced costs in communicating and analyzing data in most areas of entertainment, education, business, and science. One common aspect of computing systems is computing device readable media, commonly referred to as memory.

Data and instructions used by the computing system can be stored in and retrieved from one or more memory devices. When reading or writing to memory a corresponding read or write voltage potential is applied to a given word line based upon a decoded memory address. Referring to FIG. 1, a block diagram of a word line decoder and driver path architecture, according to the conventional art, is shown. The word line decoder and driver path 100 can include a plurality of flip flops 110 configured to latch a received address 120 upon receipt of a clock signal (e.g., rising or falling edge of a system clock signal) 130. A set of address buffers 140 can be configured to buffer the latched address bits from the flip flops 110. A word line pre-decoder 150 can be configured to partially decode the address in the address buffer 140. In one implementation, the word line pre-decoder 150 can be configured to decode a block, bank and/or the like portion of the memory from the address. A word line decoder 160 can be configured to decode a given word line from the partially decoded address from the word line pre-decoder 150. A level shifter 170 can be configured to shift the relatively low voltage potential signal propagating through the flip flops 110, address buffer 140, word line pre-decoder 150 and word line decoder 160 to an appropriate high voltage potential signal. A high voltage driver 180 can drive the word line 190 with the appropriate high voltage potential signal from the level shifter 170 during a read, write or erase operation. The combination of the flip flops 110, address buffers 140, word line pre-decoder 150 and word line decoder 160 can comprise an address decoder circuit, and the combination of the level shifter 170 and high voltage driver 180 can comprise a word line driver circuit.

The propagation delay through the word line decoder and driver path can be the sum of the clock-data out set up time of the flip flops 110 $T_{C \rightarrow Q}$, the propagation delay in the address buffers 140 $T_{AB}$, the propagation delay through the word line pre-decoder 150 $T_{WPD}$, the propagation delay through the word line decoder 160 $T_{WD}$, and the propagation delay through the level shifter 170 and high voltage driver 180 $T_{WDR}$. However, as computing devices continue to evolve there is a continuing need for faster memory devices. One possible way to increase the speed of the memory device is to reduce the propagation delay through the word line decoder and driver path. Therefore, there is a need for an improved word line decoder and driver path architecture.

SUMMARY

The present technology may best be understood by referring to the following description and accompanying drawings that are used to illustrate aspects of the present technology that are directed toward clocked driver circuits.

In one embodiment, a memory device can include a level shifter latch and a driver. The level shifter latch can be configured to receive a plurality of decoded address signals upon a first state of a clock signal and to output a plurality of word line signals. In one implementation, the clock signal can be a short pulse clock signal. The short pulse clock signal can be based on a rising edge of a system clock, and the pulse width of the short pulse clock signal can be shorter than the pulse width of the system clock. The decoded address signals can include a first and second state and the word line signals can include a third and fourth state, wherein a potential difference between the third and fourth states is greater than a potential difference between the first and second states. The driver can be configured to receive the plurality of word line signals and drive corresponding word lines with the plurality of word line signals.

In another embodiment, a device can include a plurality of inverters, a plurality of transmission gates, a latch and an inverting driver. A first inverter can include an input configured to receive a signal. A second inverter can include an input coupled to an output of the first inverter. The first and second inverters can operate from a first supply potential. A first transmission gate can include a control terminal configured to receive a clock signal and an input coupled to the output of the first inverter. A second transmission gate can include a control terminal configured to receive the clock signal and an input coupled to the output of the second inverter. The latch can include a third inverter cross-coupled to a fourth inverter. An input of the third inverter can be coupled to an output of the first transmission gate and an output of the fourth inverter. An input of the fourth inverter can be coupled to an output of the second transmission gate and an output of the third inverter. The inverting driver can include an input coupled to an output of the third inverter and an output configured to output a drive signal. The latch and inverting driver can operate from a second supply potential that is greater than the first supply potential.

In yet another embodiment, a memory device can include a memory cell array, an address buffer, an address decoder, a level shifter latch and a word line driver. The address buffer can be configured to buffer a plurality of address signals. The address decoder circuit can be configured to receive the buffered plurality of address signals and output a plurality of decoded address signals. The level shifter latch can be configured to receive the plurality of decoded address signals upon a first state of a clock signal and to output a plurality of word line signals. The address decoder circuit can be configured to operate from a first supply potential, while the level shifter latch can be configured to operate from a second supply potential that is greater than the first supply potential. The word line driver can be configured to receive the plurality of word line signals and drive the plurality of word line signals on word lines of the memory cell array.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Aspects of the present technology are illustrated by way of example and not by way of limitation, in the figures of the accompanying drawings and in which like reference numerals refer to similar elements and in which.

DETAILED DESCRIPTION

Figure 1:
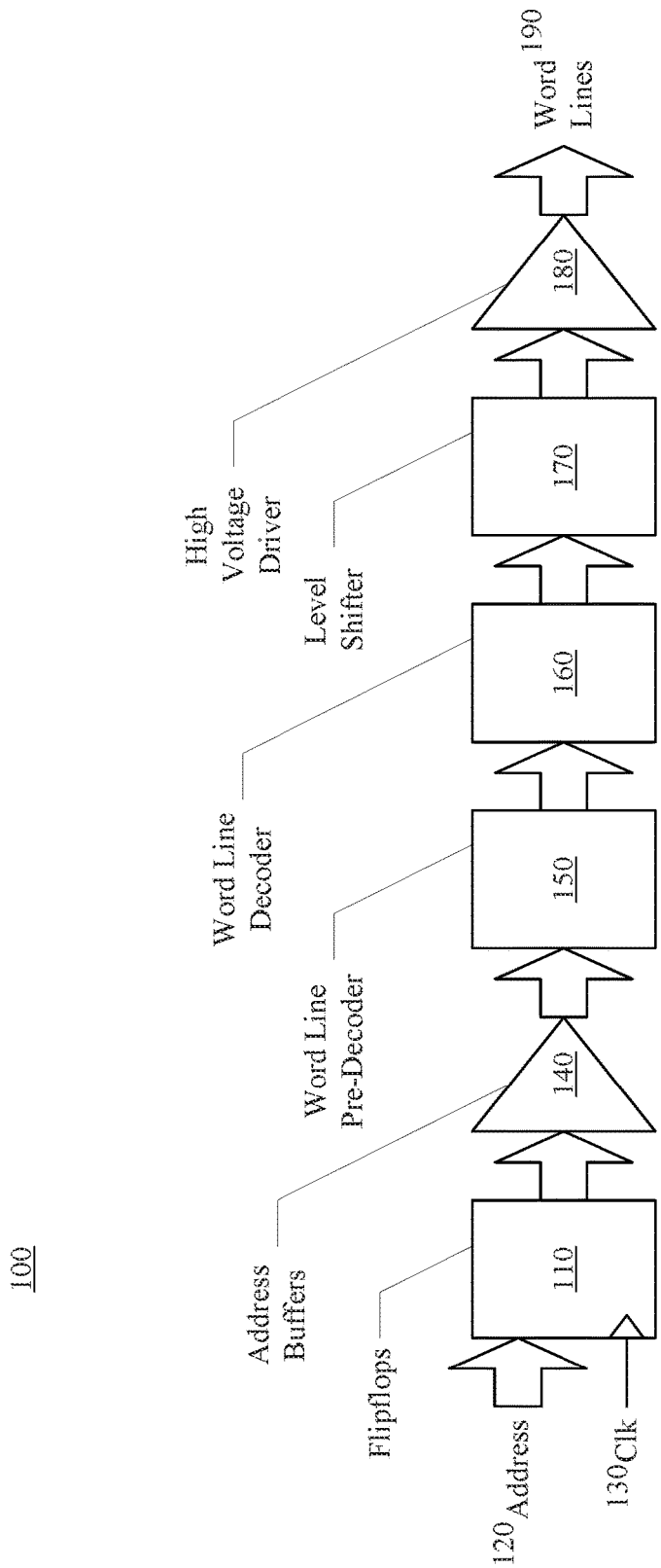
FIG. 1 shows a block diagram of a word line decoder and driver path architecture, according to the conventional art.

Reference will now be made in detail to the aspects of the present technology, examples of which are illustrated in the accompanying drawings. While the present technology will be described in conjunction with these aspects, it will be understood that they are not intended to limit the invention to these aspects. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some aspects of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to aspects of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Figure 2:
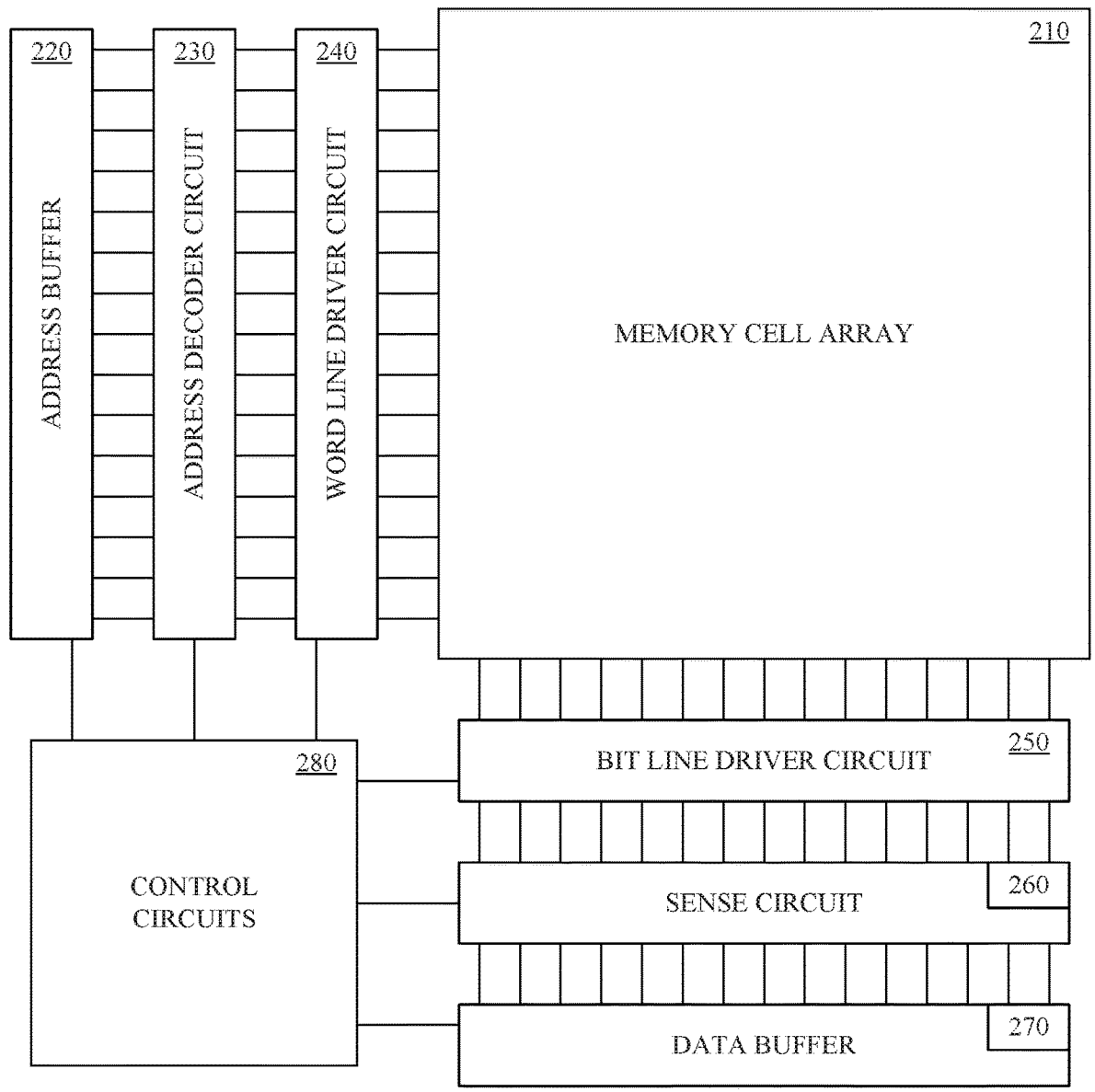
FIG. 2 shows a block diagram of a memory device, in accordance with aspects of the present technology.

Referring now to FIG. 2, a block diagram of a memory device, in accordance with aspects of the present technology, is shown. The memory device 200 can be a Magnetoresistive Random Access Memory (MRAM), Spin Torque Magnetoresistive Random Access Memory (ST-MRAM), a Phase Change Memory (PCM), a stackable cross-gridded Phase Change Memory, Resistive Random Access Memory (Re-RAM), or similar memory device. In some aspects, the memory device 200 can include a memory cell array 210, an address buffer 220, an address decoder circuit 230, a word line driver circuit 240, a bit line driver circuit 250, a sense circuit 260, a data buffer 270, and control circuit 280. The memory device 200 can also include other well-known circuits that are not necessary for an understanding of the present technology and therefore are not discussed herein.

In some aspects, the memory cell array 210 can include a plurality of memory cells organized in rows and columns, with sets of word lines, bit lines and optionally source lines spanning the array of cells throughout the chip. The address buffer 220 can be configured to receive and buffer a plurality of address signals. The address decoder 230 can receive the plurality of address signals buffered by the address buffer 220 and output a plurality of decoded address signals. The address decoder 230 can map a given memory address to a particular row of memory cells in the array.

In some aspects, the output of the address decoder 230 can be input to the word line driver 240 upon a first state of a clock signal. In one implementation, the word line driver 240 can receive the plurality of decoded address signals upon receipt of a high state of a clock signal. The word line driver 240 can level shift the received decoded address signals that include one or more of a first potential voltage and a second potential voltage to word line drive signals that include one or more of a third potential voltage and a fourth potential voltage, and latch the plurality of word line drive signals that include the one or more of the third potential voltage and the fourth potential voltage. The potential difference between the third and fourth potential voltages can be greater than the potential difference between the first and second potential voltages. The output of the word line driver 240 can drive the word lines to select a given word line of the array 210 based on the plurality of word line drive signals.

In some aspect, the bit line driver 250 and the sense circuit 260 utilize the bit lines, and/or optionally the source lines, of the array 210 to read from and write to memory cells of a selected word line of the array 210. The data read from and written to the memory cells can be buffered in the data buffer 270. The control circuit 280 can generate one or more control signals for the control of one or more of the address buffer 220, the address decoder circuit 230, the word line driver circuit 240, the bit line driver circuit 250, the sense circuit 260, the data buffer 270.

Figure 3:
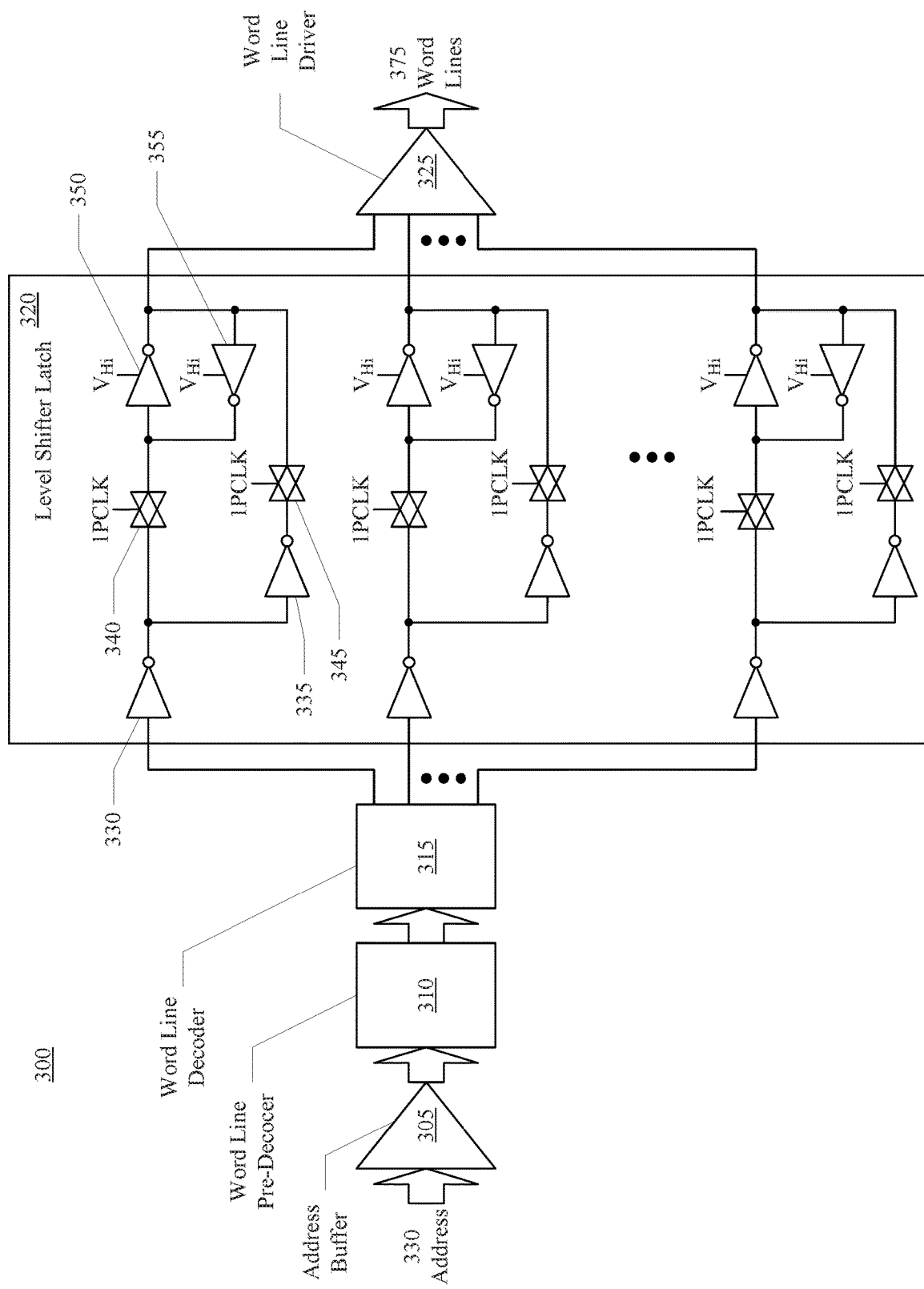
FIG. 3 shows a block diagram of a word line decoder and driver path architecture, in accordance with aspects of the present technology.

Referring now to FIG. 3, a block diagram of a word line decoder and driver path architecture, in accordance with aspects of the present technology, is shown. In some aspects, the word line decoder and driver path architecture 300 can include an address buffer 305, a word line pre-decoder 310, a word line decoder 315, a level shifter latch 320, and a word line driver 325. The address buffer 305 can be configured to receive and buffer a plurality of address signals 330. The word line pre-decoder 310 can be configured to receive the buffered plurality of address signals and output partially decoded address signals. In one implementation, the word line pre-decoder 310 can be configured to decode a block, bank and/or the like portion of the memory from the buffered plurality of address signals. The word line decoder 315 can be configured to receive the partially decoded address signal and output a plurality of decoded address signals. In one implementation, the word line decoder 315 can be configured to decode a given word line from the buffered plurality of address signals. The level shifter latch 320 can be configured to receive the plurality of decoded address signals upon a first state of a clock signal and to output a plurality of word line signals. In one implementation, the plurality of decoded address signals can include one or more of a first potential voltage and a second potential voltage. The plurality of word line signals can include one or more of a third potential voltage and a fourth potential voltage, wherein a potential difference between the third potential voltage and the fourth potential voltage is greater than a potential difference between the first potential voltage and the second potential voltage. For example, the decoded address signals can be signals having either a ground potential state (e.g., low logic state) or a low supply voltage potential (e.g., high logic state). The word line signals can be signals having either a ground potential state (e.g., low drive state) or a high supply voltage potential (e.g., high drive state).

In some aspects, the level shifter latch 320 can include, for each of the plurality of word lines, a first inverter 330, a second inverter 335, a first transmission gate 340, a second transmission gate 345, a third inverter 350, and a fourth inverter 355. The first inverter 330 can including an input configured to receive a first one of the plurality of decoded address signals. The second inverter 335 can include an input coupled to an output of the first inverter 330. The first transmission gate 340 can include a first terminal coupled to the output of the first inverter 330, a second terminal configured to receive a short pulse clock signal (1PCLK), and a third terminal. The second transmission gate 345 can include a first terminal coupled to an output of the second inverter 335, a second terminal configured to receive the short pulse clock signal (1PCLK), and a third terminal. The third inverter 350 can include an input coupled to the third terminal of the first transmission gate 340, power terminals coupled between a high voltage source ($V_{Hi}$), and an output terminal configured to output a first one of the plurality of word line signals. The fourth inverter 355 can include an input coupled to the third terminal of the second transmission gate 345 and the output of third inverter 350, power terminals coupled between the high voltage source ($V_{Hi}$), and an output terminal coupled to the input of the third inverter 350.

Figure 4:
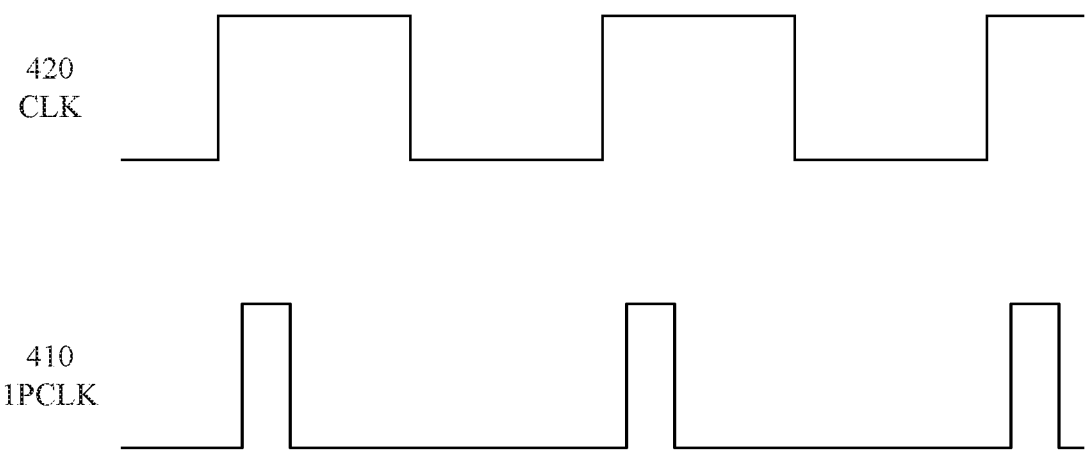
FIG. 4 shows a timing diagram illustrating a short clock pulse utilized in the word line decoder and driver path architecture, in accordance with aspect of the present technology.

In some aspects, the third and fourth inverter 350, 355 form a bi-stable latch with two stable states. The first transmission gate 340 can pass a complement of the decoded address signal to a first terminal of the bi-stable latch during a given state (e.g., logic high) of the short clock pulse signal, while the second transmission gate 345 can pass the decoded signal to a second terminal of the bi-stable latch. The short pulse clock signal (1PCLK) 410 can be generated based on a rising edge of a system clock (CLK) 420, as illustrated in FIG. 4. The short pulse clock signal at the gate of the first and second transmission gates 340, 345 can transfer the address to the third and fourth inverters 350, 355 at the rising edge of the system clock (CLK) 420. The pulse width of the short pulse clock signal (1PCLK) 410 can extend the hold time of the address. The pulse width of the short pulse clock signal (1PCLK) 410 should be less than the pulse width of the system clock (CLK) 420. The output of the level shifter latch 320 can be taken at the second terminal of the bi-stable latch.

In one implementation, when the decoded address signal is in a logic low state, the first inverter 330 generates a logic high state at its output and the second inverter 335 generates a logic low state at its output. The first pass gate 340 passes the logic high state from the first inverter 330 to an input of the third inverter 350 when the short pulse clock signal (1PCLK) is in a given state (e.g., logic high state), and the second pass gate 345 passes the logic low state from the second inverter 335 to an input of the fourth inverter 355 when the short pulse clock signal (1PCLK) is in the given state. The logic high state at the input to the third inverter 350 and the logic low state at the input to the fourth inverter 355 will drive the output of the bi-stable latch to the low drive state. When the decoded address signal is in a logic high state, the first inverter 330 generates a logic low state at its output and the second inverter 335 generates a logic high state at its output. The first pass gate 340 passes the logic low state from the first inverter 330 to an input of the third inverter 350 when the short pulse clock signal (1PCLK) is in the given state (e.g., logic high state), and the second pass gate 345 passes the logic high state from the second inverter 335 to an input of the fourth inverter 355 when the short pulse clock signal (1PCLK) is in the given state. The logic low state at the input to the third inverter 350 and the logic high state at the input to the fourth inverter 355 will drive the output of the bi-stable latch to the high drive state. The logic level of the decoded address signal (e.g., logic low or logic high) is shifted to the drive level of the word line signal (e.g., low drive state or high drive state) as a result of the high voltage source ($V_{Hi}$) supplied to the third and fourth inverters 350, 355 of the bi-stable latch. The level shifted word line signals can be output by the level shifter latch 320. The word line driver 325 can be configured to receive the plurality of word line signals and drive the plurality of word line signals on corresponding ones of the plurality of word lines 375.

Figure 5:
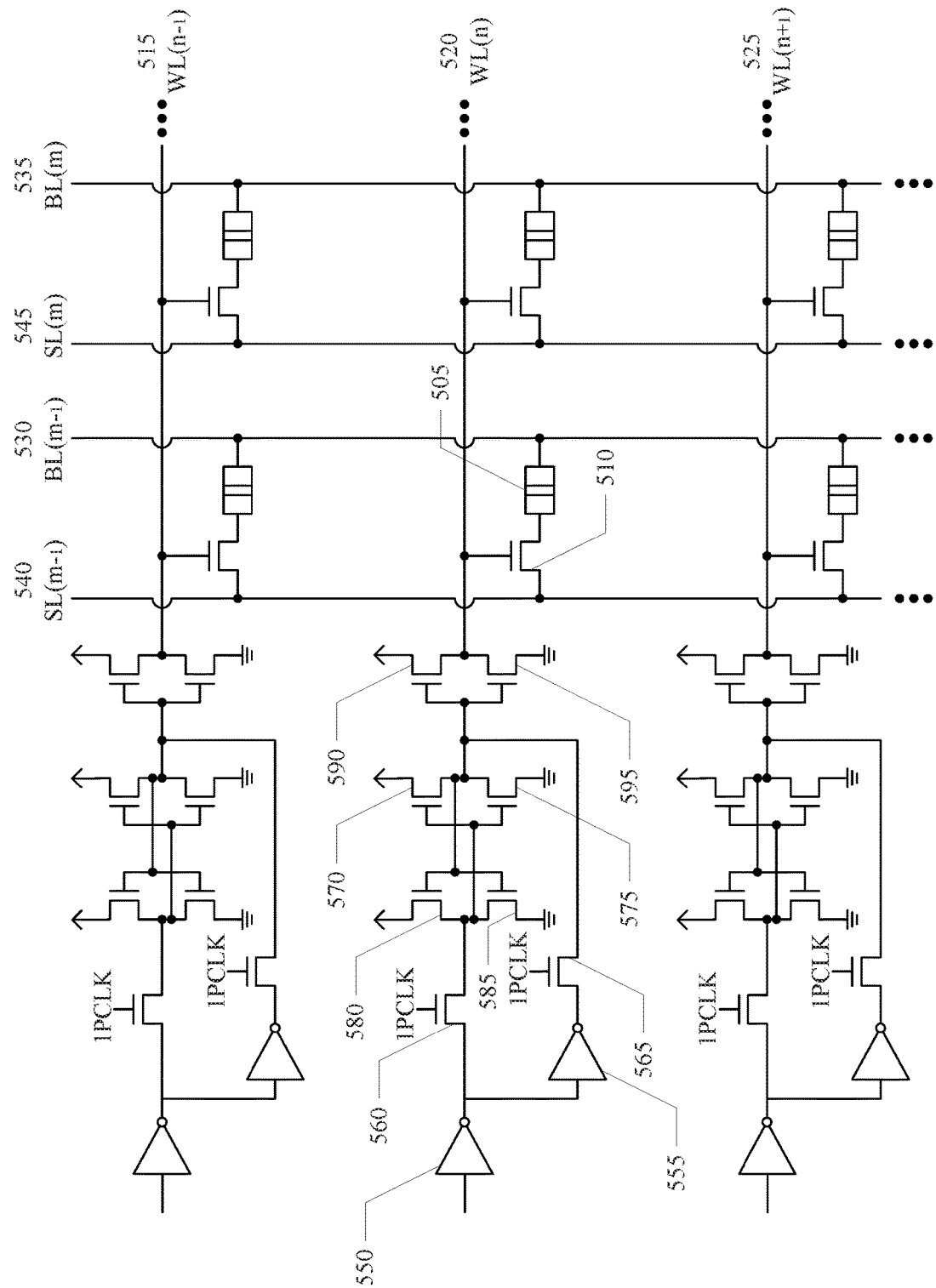
FIG. 5 shows a block diagram of a word line driver in combination with a memory cell array, in accordance with aspects of the present technology.

Referring now to FIG. 5, a block diagram of a word line driver in combination with a memory cell array, in accordance with aspects of the present technology, is shown. The memory cell array can be any one of a number of memory cell architectures, such as NAND Flash memory, Magnetoresistive Random Access Memory (MRAM), or the like that can benefit from a fast word line drive circuit due to characteristics such as relatively high capacitive word lines. While aspects of the present technology are described herein in conjunction with MRAM memory cell arrays, it will be understood that they are not intended to be limited thereto.

In some aspects, the MRAM memory cell array can include a plurality of memory cells 505, 510, a plurality of word lines 515-525, a plurality of bit lines 530-535, and a plurality of source lines 540-545. The word lines 515-525 of the memory cell array can be organized along rows of the array. The bit lines 530-535 and the source lines 540-545 can be organized along columns of the array. Each memory cell 505, 510 can include a Magnetic Tunneling Junction (MTJ) cell 505 and an access transistor 510. In one implementation, the MTJ cells can be Spin Torque Magnetoresistive memory cells. The gates of the access transistors 510 arranged along rows of the array can be coupled to a respective word line 520. The sources of the access transistors 510 arranged along columns of the array can be coupled to respective source lines 540. A free magnetic layer of the MTJ cell 505 arranged along columns of the array can be coupled to respective bit lines 530.

In some aspects, the magnetic polarity of the free layer of the MTJ cell 505, and corresponding logic state of the cell, can be changed to one of two states depending upon the direction of current flowing through the MTJ cell 505. For example, a logic '0' state can be written to the memory cell 505, 510 by biasing the respective bit line 530 at a bit line write potential (e.g., $V_{BLW}$), biasing the respective source line 540 at a ground potential, and driving the respective word line 520 at a word line write potential (e.g., $V_{WLW}=V_{Hi}$). A logic '1' state can be written to the given memory cell 505, 510 by biasing the respective bit line 530 at a ground potential, biasing the respective source line 540 at a source line write potential (e.g., $V_{SLW}$), and driving the respective word line 520 at the word line write potential (e.g., $V_{WLW}=V_{Hi}$). The state of the memory cell 505, 510 can be read by biasing the respective bit line 530 at a bit line read potential (e.g., $V_{BLR}$), biasing the respective source line 540 at a ground potential, driving the respective word line 520 at a word line read potential ($V_{WLR}=V_{Hi}$), and sensing the resulting current on the respective bit line 530.

In another example, a logic '0' state can be written to a given memory cell 505, 510 by biasing the respective bit line 530 at a bit line write potential (e.g., $V_{BLW}$), biasing the respective source line 540 at a ground potential, and driving the respective word line 520 at a word line write potential (e.g., $V_{WLW}=V_{Hi}$). A logic '1' state can be written to the given memory cell 505, 510 by biasing the respective bit line 530 at a ground potential, biasing the respective source line 540 at a source line write potential (e.g., $V_{SLW}$), and driving the respective word line 520 at the word line write potential (e.g., $V_{WLW}=V_{Hi}$). The state of the memory cell 505, 510 can be read by biasing the respective bit line 530 at a ground potential, biasing the respective source line 540 at a source line read potential (e.g., $V_{SLR}$), driving the respective word line 520 at a word line read potential (e.g., $V_{WLR}=V_{Hi}$), and sensing the resulting current on the respective source line 540.

In some aspects, the word line driver can include, for each of a plurality of word lines, a first inverter 550, a second inverter 555, a first transmission gate 560, a second transmission gate 565, a level shifter latch 570-585, and an inverting driver 590, 595. The first inverter 550 can include an input configured to receive a decoded address signal. The second inverter 555 can include an input coupled to an output of the first inverter 550. The first and second inverters 550, 555 can operate from a first supply potential.

In some aspects, the first transmission gate 560 can include a control terminal configured to receive a short pulse clock signal (1PCLK) and an input coupled to the output of the first inverter 550. The second transmission gate 565 can include a control terminal configured to receive the short pulse clock signal (1PCLK) and an input coupled to the output of the second inverter 555. Again, the short pulse clock signal (1PCLK) can be generated based on the rising edge of a system clock (CLK). In one implementation, the first and second transmission gates 560, 565 can be first and second Metal Oxide Semiconductor Field Effect Transistors (MOSFETs) respectively. MOSFETs can be either p-channels MOSFETs or n-channels MOSFETs. The first MOSFET 560 can include a gate configured to receive the short pulse clock signal (1PCLK), a source coupled to the output of the first inverter 550, and a drain coupled to the input of the first latch inverter 570, 575. The second MOSFET 565 can include a gate configured to receive the short pulse clock signal (1PCLK), a source coupled to the output of the second inverter 555, and a drain coupled to an input of the second latch inverter 580, 585. In one implementation, first and second MOSFETs 560, 565 can be n-MOSFETs. In other implementations, it may be possible to use transmission gates or buffers in place of the first and second MOSFETs 560, 565.

In some aspects, the level shifter latch 570-585 can include a first latch inverter 570, 575 cross coupled to a second latch inverter 580, 585. An input of the first latch inverter 570, 575 can be coupled to an output of the first clocked transmission gate 560 and an output of the second latch inverter 580, 585. The input of the second latch inverter 580, 585 can be coupled to an output of the second clocked transmission gate 565 and an output of the first latch inverter 570, 575. The level shifter 570-585 can operates from a second supply potential that is greater than the first supply potential. In one implementation, the first latch inverter 570, 575 includes a first p-MOSFET 570 and a first n-MOSFET 575. A gate of the first p-MOSFET 570 and a gate of the first n-MOSFET 575 can be coupled together as the input of the first latch inverter 570, 575, a drain of the first p-MOSFET 570 and a drain of the first n-MOSFET 575 can be coupled together as the output of the first latch inverter 570, 575, and a source of the first p-MOSFET 570 and the source of the first n-MOSFET 575 can be coupled between the second supply potential. The second latch inverter 580, 585 can include a second p-MOSFET 580 and a second n-MOSFET 585. A gate of the second p-MOSFET 580 and a gate of the second n-MOSFET 585 can be coupled together as the input of the second latch inverter 580, 585, a drain of the second p-MOSFET 580 and a drain of the second n-MOSFET 585 can be coupled together as the output of the second latch inverter 580, 585, and a source of the second p-MOSFET 580 and the source of the second n-MOSFET 585 can be coupled between the second supply potential. It should also be appreciated that the drain and source of MOSFET devices are generally interchangeable, such that the description of the sources and drains of MOSFET herein can be interchanged.

In some aspects, the inverting driver 590, 595 can include an input coupled to an output of the first latch inverter 570, 575 and the output of the second clocked transmission gate 565, and an output coupled to a word line (WL(n)) 520. The inverting driver 590, 595 can operate from the second supply potential. In one implementation, the inverting driver 590, 595 can include a p-MOSFET 590 and a n-MOSFET 595. A gate of the p-MOSFET 590 and the gate of the n-MOSFET 595 can be coupled together as the input of the inverting driver 590, 595, a drain of the p-MOSFET 590 and a drain of the n-MOSFET 595 can be coupled together as the output of the inverting driver 590, 595, and a source of the p-MOSFET 590 and a source of the n-MOSFET 595 can be coupled between the second supply potential.

In some aspects, the first inverter 550, the second inverter 555, the first transmission gate 560, the second transmission gate 565, the level shifter 570-585, and the inverting driver 590, 595 of the word line driver can drive the word line 520 when the word line 520 is selected by a decoded address signal. For example, when the decoded address signal is in a logic low state, the first inverter 550 generates a logic high state at its output and the second inverter 555 generates a logic low state at its output. The first transmission gate 560 passes the logic high state from the first inverter 550 to an input of the first latch inverter 570, 575 when the short pulse clock signal (1PCLK) is in a given state (e.g., logic high state), and the second transmission gate 565 passes the logic low state from the second inverter 555 to an input of the second latch inverter 580, 585 when the short pulse clock signal (1PCLK) is in the given state. The logic high state at the input to the first latch inverter 570, 575 and the logic low state at the input to the second latch inverter 580, 585 will drive the output of the bi-stable level shifter latch 570-585 to the low drive state. In response to the low drive state from the level shifter latch 570-585, the inverting driver 590, 595 generates a high drive state to drive the given word line 520 to select the memory cells 505, 510 on the given word line 520. When the decoded address signal is in a logic high state, the first inverter 550 generates a logic low state at its output and the second inverter 555 generates a logic high state at its output. The first pass gate 560 passes the logic low state from the first inverter 550 to an input of the first latch inverter 570, 575 when the short pulse clock signal (1PCLK) is in the given state (e.g., logic high state), and the second pass gate 565 passes the logic high state from the second inverter 555 to an input of the second latch inverter 580, 585 when the short pulse clock signal (1PCLK) is in the given state. The logic low state at the input to the first latch inverter 570, 575 and the logic high state at the input to the second latch inverter 580, 585 will drive the output of the bi-stable level shifter latch 570-585 to the high drive state. The logic level of the decoded address signal (e.g., logic low or logic high) is shifted to the drive level of the word line signal (e.g., low drive state or high drive state) as a result of the high voltage source ($V_{Hi}$) supplied to the first and second latch inverters of the bi-stable level shifter latch 570-585. In response to the high drive state from the level shifter latch 570-585, the inverting driver 590-595 generates a low drive state on the given word line 520 to de-select the memory cells 505, 510 on the given word line 520.

Figure 6:
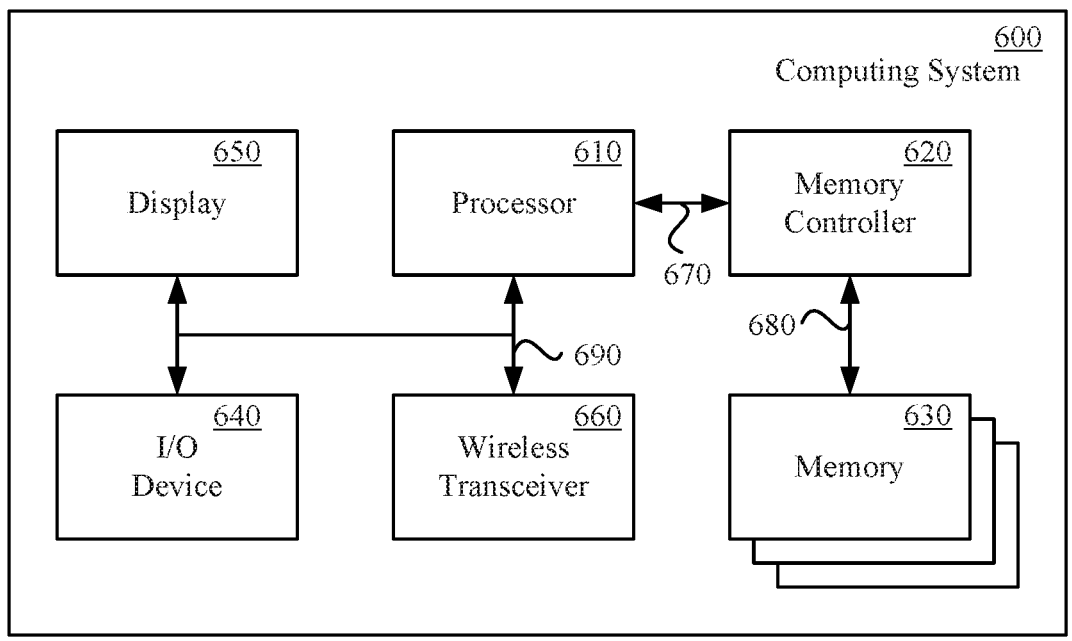
FIG. 6 shows a block diagram of a computing system including a memory device, in accordance with aspects of the present technology.

Referring now to FIG. 6, a block diagram of a computing system including a memory device, in accordance with aspects of the present technology, is shown. The computing system 600 can, for example, be a cellular telephone, smart phone, e-reader, tablet personal computer (PC), laptop PC, desktop PC, gaming console, workstation, server computer, or other similar computing device. The computing system 600 can include one or more processors 610, one or more memory controllers 620, one or more memory devices 630, and one or more input/output devices 640-660 communicatively coupled together by one or more buses 670-690. The one or more input/output devices 640 can include, for example, a display 650, a wireless transceiver 660 and the like. The computing system 600 can also include other sub-circuits that are not necessary for an understanding of the present technology and therefore are not discussed herein.

The one or more memory controllers 620 can be operable to control access to data stored in the one or more memory devices 630 for use by the one or more processors 610, one or more input/output devices 640 and/or other sub-systems of the computing system 600. The one or more memory controllers 620 can generate commands for reading and writing of data in the one or more memory devices 630 in response to memory requests received from the one or more processors 610, one or more input/output devices 640 and/or other sub-systems. One or more of the memory devices 630 can include the word line driver circuit as described herein with regard to FIGS. 2-4.

Figure 7:
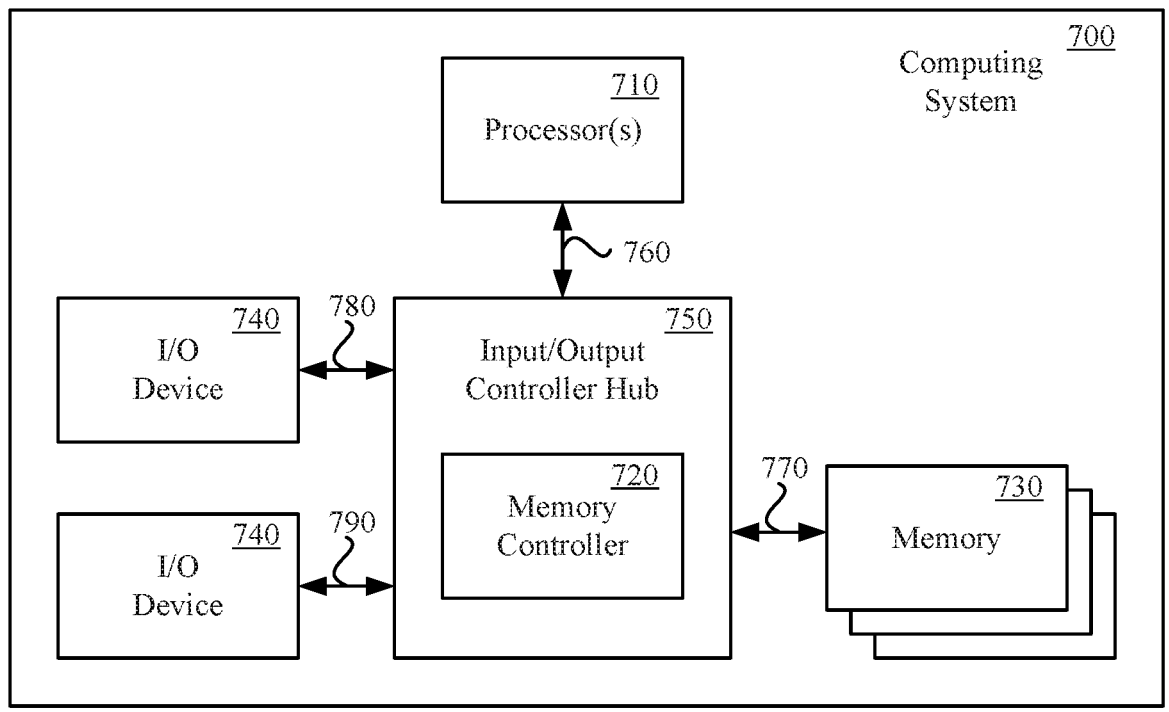
FIG. 7 shows a block diagram of a computing system including a memory device, in accordance with aspects of the present technology.

Referring now to FIG. 7, a block diagram of a computing system including a memory device, in accordance with aspects of the present technology, is shown. The computing system 700 can, for example, be a cellular telephone, smart phone, e-reader, table personal computer (PC), laptop PC, desktop PC, gaming console, workstation, server computer, or other similar computing device. The computing system 700 can include one or more processors 710, one or more memory controllers 720, one or more memory devices 730, and one or more input/output devices 740 that can be communicatively coupled together by one or more input/output controller hubs 750 through one or more buses 760-790. The computing system 700 can also include other sub-circuits that are not necessary for an understanding of the present technology and therefore are not discussed herein.

The one or more memory controllers 720 can be integral to one or more other sub-circuits such as the one or more input/output controller hubs 750 and/or memory devices 730, or can be implemented as a separate sub-circuit. The one or more memory controllers 720 can be operable to control access to data stored in the one or more memory devices 730 for use by the one or more processors 710, one or more input/output devices 740 and/or other sub-systems of the computing system 700. The one or more memory controllers 720 can generate commands for reading and writing of data in the one or more memory devices 730 in response to memory requests received from the one or more processors 710, one or more input/output devices 740 and/or other sub-systems. One or more of the memory devices 730 can include the word line driver circuit as described herein. with regard to FIGS. 2-4.

Figure 8:
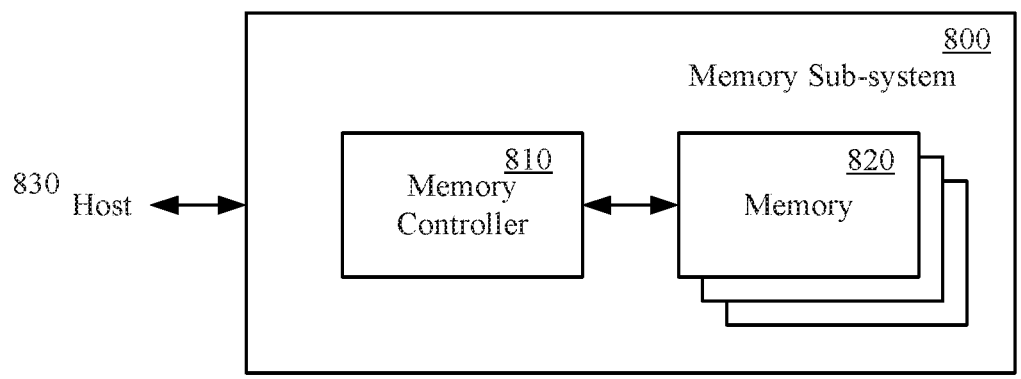
FIG. 8 shows a block diagram of a memory sub-system, in accordance with aspects of the present technology.

Referring now to FIG. 8, a block diagram of a memory sub-system, in accordance with aspects of the present technology, is shown. The memory sub-system 800 can include one or more memory controllers 810 and one or more memory devices 820. The memory sub-system 800 can be a memory expansion card, Solid State Drive (SSD), or the like that is configurable to be coupled to a host device 830 such as a cellular telephone, smart phone, e-reader, table personal computer (PC), laptop PC, desktop PC, gaming console, workstation, server computer, or other similar computing device. The memory sub-system 800 can be coupled to the host device 830 as in internal or external peripheral device.

The one or more memory controllers 810 can be operable to control access to data stored in the one or more memory devices 820 for use by the host device 830. The one or more memory controllers 810 can generate commands for reading and writing of data in the one or more memory devices 820 in response to memory requests received from the host device 830. One or more of the memory devices 820 can include the word line driver circuit as described herein with regard to FIGS. 2-4.

Figure 9:
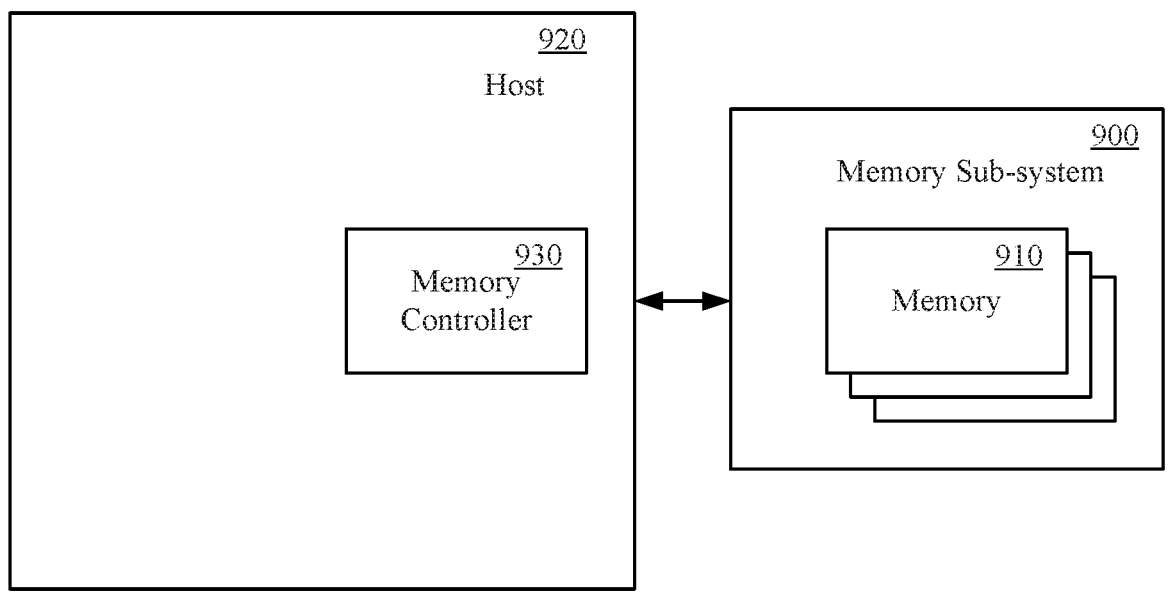
FIG. 9 shows a block diagram of a memory sub-system, in accordance with aspects of the present technology.

Referring now to FIG. 9, a block diagram of a memory sub-system, in accordance with aspects of the present technology, is shown. The memory sub-system 900 can include one or more memory devices 910. The memory sub-system 900 can be a memory expansion card, Solid State Drive (SSD), or the like that is configurable to be coupled to a host device 920 such as a cellular telephone, smart phone, e-reader, table personal computer (PC), laptop PC, desktop PC, gaming console, workstation, server computer, or other similar computing device. The host device 920 can include one or more memory controllers 930. The memory subsystem 900 can be coupled to the host device 920 as in internal or external peripheral device.

The one or more memory controllers 930 can be operable to control access to data stored in the one or more memory devices 910 for use by the host device 920. The one or more memory controllers 930 can generate commands for reading and writing of data in the one or more memory devices 910 in response to memory requests received from the host device 920. One or more of the memory devices can include the word line driver circuit 240 as described herein with regard to FIGS. 2-4.

The computing systems and memory sub-systems of FIG. 5-9 are illustrative of exemplary embodiments, and are not intended to limit aspects of the present technology. The word line driver circuit as described herein can be readily applied to any number of conventional memory devices, memory sub-systems, and/or computing systems, along with memory devices, memory sub-systems, and/or computing systems to be developed in the future.

The word line decoder and driver circuit in accordance with aspects of the present technology advantageously reduces delay in the word line driver circuit. In aspects, the address can be decoded and transfer to the level shifter latch as soon as the clock signal is received. The latching function is advantageously moved toward the end of the word line decoder and driver circuit. The delay of the word line decoder and driver circuit in accordance with aspects of the present technology can be the sum of the transmission gate delay and the propagation delay through the level shifter latch and word line driver (e.g., Ttr+Twdr), as compared to the sum of flip flop latch delay, the propagation delay through the address buffer, the propagation delay through the word line pre-decoder, the propagation delay through the word line decoder, and the propagation through the level shifter and word line driver (e.g., Tc→q+Tab+Twpd+Twd+Twdr). Aspects of the present technology also advantageously eliminate the use of a clocked flip flop, which can reduce the area of the word line decoder and driver circuit in the Integrated Circuit (IC) chip of the device.

The foregoing descriptions of specific aspects of the present technology have been presented for purposes of illustration and description. They are not intended to be exhaustive or to limit the invention to the precise forms disclosed, and obviously many modifications and variations are possible in light of the above teaching. The aspects were chosen and described in order to best explain the principles of the present technology and its practical application, to thereby enable others skilled in the art to best utilize the present technology and various aspects with various modifications as are suited to the particular use contemplated. It is intended that the scope of the invention be defined by the claims appended hereto and their equivalents.

What is claimed is:

1. A memory device comprising:
a plurality of word lines;
a level shifter latch configured to receive a plurality of decoded address signals upon a first state of a clock signal and to output a plurality of word line signals, wherein the level shifter latch includes
a first inverter including an input configured to receive one of the plurality of decoded address signals;
a second inverter including an input coupled to an output of the first inverter;
a first transmission gate including a first terminal coupled to the output of the first inverter, and a second terminal configured to receive a short pulse clock signal, wherein the short pulse clock signal is based on a rising edge of a system clock and has a shorter pulse width then the pulse width of the system clock;
a second transmission gate including a first terminal coupled to an output of the second inverter, and a second terminal configured to receive the short pulse clock signal;
third inverter circuit including an input coupled to a third terminal of the first transmission gate, power terminals coupled between a high voltage source, and an output terminal configured to output a first one of the plurality of word line signals; and
a fourth inverter circuit including a input coupled to a third terminal of the second transmission gate and the output of first inverter circuit, power terminals coupled between the high voltage source, and an output coupled to the input of the first inverter circuit; and
a word line driver configured to receive the plurality of word line signals and drive the plurality of word line signals on corresponding ones of the plurality of word lines.

2. The memory device of claim 1, wherein,
the plurality of decoded address signals include a first state and a second state; and
the plurality of word line signals include a third state and a fourth state, wherein a potential difference between the third state and the fourth state is greater than a potential difference between the first state and the second state.

3. The memory device of claim 1, further comprising:
an address buffer configured to receive and buffer a plurality of address signals;
a word line pre-decoder configured to receive the buffered plurality of address signals and output partially decoded address signals; and
a word line decoder configured to receive the partially decoded address signal and output the plurality of decoded address signals.

4. The memory device of claim 1, further comprising:
an array of memory cells arranged in columns and rows, wherein sets of a first number of cells arranged along columns are coupled to corresponding ones of a plurality of bit lines and sets of a second number of cells arranged along rows are coupled to corresponding ones of the plurality of word lines.

5. The memory device of claim 4, wherein each memory cell includes a select gate and a Magnetic Tunnel Junction (MTJ) coupled in series between a corresponding one of the plurality of bit lines and a corresponding one of the plurality of source lines, and wherein a control terminal of the select gate is coupled to a corresponding one of the plurality of word lines.

6. The memory device of claim 4, wherein the array of memory cells comprise an array of Spin Torque Magnetoresistive memory cells.

7. A memory device comprising:
a memory cell array including a plurality of word lines;
an address buffer configured to buffer a plurality of address signals, wherein the address buffer operates from a first supply potential;
an address decoder circuit configured to receive the buffered plurality of address signals and output a plurality of decoded address signals, wherein the address decoder operates from the first supply potential;
a level shifter latch configured to receive the plurality of decoded address signals upon a first state of a clock signal and to output a plurality of word line signals, wherein the level shifter latched operates form a second supply potential that is greater than the first supply potential, and wherein the level shifter latch includes;
  a first inverter including an input configured to receive one of the plurality of decoded address signals;
  a second inverter including an input coupled to an output of the first inverter;
  a first transmission gate including a control terminal configured to receive the clock signal and an input coupled to the output of the first inverter;
  a second transmission gate including a control terminal configured to receive the clock signal and an input coupled to the output of the second inverter; and
  a latch including a third inverter cross coupled to a fourth inverter, wherein an input of the third inverter is coupled to an output of the first transmission gate and an output of the fourth inverter, wherein an input of the fourth inverter is coupled to an output of the second transmission gate and an output of the third inverter, and wherein the latch operates from a second supply potential that is greater than the first supply potential; and
a word line driver configured to receive the plurality of word line signals and drive the plurality of word line signals on corresponding ones of the plurality of word lines, wherein the word line driver operates form the second supply potential.

8. The memory device of claim 7, wherein the memory cell array comprises a Magnetoresistive memory cell array.

9. The memory device of claim 7, wherein the word line driver comprises:
an inverting driver including an input coupled to an output of the third inverter and an output coupled to a corresponding one of the plurality of word lines, wherein the inverting driver operates from the second supply potential.

* * * * *